(12) United States Patent
Hu et al.

(10) Patent No.: US 10,886,597 B2
(45) Date of Patent: Jan. 5, 2021

(54) HOUSING, ANTENNA DEVICE AND MOBILE TERMINAL

(71) Applicant: GUANGDONG OPPO MOBILE TELECOMMUNICATIONS CORP., LTD., Dongguan (CN)

(72) Inventors: Shasha Hu, Dongguan (CN); Ning Zhao, Dongguan (CN); Shengzhao Xiang, Dongguan (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 167 days.

(21) Appl. No.: 15/798,823

(22) Filed: Oct. 31, 2017

(65) Prior Publication Data

US 2018/0069293 A1    Mar. 8, 2018

Related U.S. Application Data

(63) Continuation of application No. PCT/CN2016/086566, filed on Jun. 21, 2016.

(30) Foreign Application Priority Data

Mar. 21, 2016  (CN) .......................... 2016 1 0163702
Apr. 29, 2016  (CN) .......................... 2016 1 0287114
Apr. 29, 2016  (CN) .......................... 2016 1 0287147

(51) Int. Cl.
*H01Q 1/24*    (2006.01)
*H01Q 1/44*    (2006.01)
(Continued)

(52) U.S. Cl.
CPC .............. *H01Q 1/24* (2013.01); *H01Q 1/243* (2013.01); *H01Q 1/44* (2013.01); *H01Q 21/28* (2013.01); *H01Q 21/30* (2013.01); *H05K 5/04* (2013.01)

(58) Field of Classification Search
CPC ............ H01Q 1/24; H01Q 1/243; H01Q 1/44; H01Q 21/28; H01Q 21/30; H05K 5/04
See application file for complete search history.

(56) References Cited

U.S. PATENT DOCUMENTS 8,373,610 B2    2/2013 Chiang et al.
2004/0017329 A1  1/2004 Fang et al.
(Continued)

FOREIGN PATENT DOCUMENTS

CN    102142855 A    8/2011
CN    103280623 A    9/2013
(Continued)

OTHER PUBLICATIONS

European Patent Application No. 16895065.7 extended Search and Opinion dated Apr. 25, 2018, 8 pages.
(Continued)

*Primary Examiner* — Dimary S Lopez Cruz
*Assistant Examiner* — Bamidele A Jegede
(74) *Attorney, Agent, or Firm* — Lathrop GPM LLP

(57) ABSTRACT

A housing is provided. The housing includes a first housing area, a second housing area, a slit strip and a connecting segment, the slit strip includes at least one slit, the first housing area and the second housing area are located at two sides of the slit strip, the connecting segment are located at an extending path of the slit strip, the connecting segment electrically conductively couples the first housing area and the second housing area. An antenna device and a mobile terminal are also provided by the present disclosure.

19 Claims, 9 Drawing Sheets

(51) Int. Cl.
*H05K 5/04* (2006.01)
*H01Q 21/28* (2006.01)
*H01Q 21/30* (2006.01)

(56) References Cited

U.S. PATENT DOCUMENTS

| | | | |
|---|---|---|---|
| 2009/0153409 A1 | 6/2009 | Chiang et al. | |
| 2011/0263300 A1* | 10/2011 | Nishizono | H01Q 1/243 455/566 |
| 2012/0007783 A1* | 1/2012 | Taura | H01Q 1/2266 343/702 |
| 2013/0099983 A1* | 4/2013 | Han | H01Q 1/243 343/702 |
| 2013/0169490 A1* | 7/2013 | Pascolini | H01Q 1/243 343/702 |
| 2013/0244739 A1* | 9/2013 | Arkko | H04M 1/026 455/575.7 |
| 2013/0293425 A1* | 11/2013 | Zhu | H01Q 1/243 343/702 |
| 2014/0125528 A1* | 5/2014 | Tsai | H01Q 13/106 343/702 |
| 2014/0183269 A1* | 7/2014 | Glaser | G06F 21/32 235/492 |
| 2014/0368398 A1* | 12/2014 | Ying | H01Q 1/48 343/841 |
| 2015/0054701 A1* | 2/2015 | Kim | H01Q 9/0442 343/750 |
| 2015/0255855 A1* | 9/2015 | Tsai | H01Q 1/273 343/702 |
| 2016/0134010 A1* | 5/2016 | Yan | H01Q 1/1207 343/702 |
| 2017/0149118 A1* | 5/2017 | Wang | H01Q 1/243 |

FOREIGN PATENT DOCUMENTS

| | | |
|---|---|---|
| CN | 203775569 A | 8/2014 |
| CN | 203886669 U | 8/2014 |
| CN | 104584324 A | 4/2015 |
| CN | 105337036 A | 2/2016 |
| CN | 205081217 U | 3/2016 |
| CN | 205092313 U | 3/2016 |
| CN | 105655701 A | 6/2016 |
| CN | 205657165 U | 10/2016 |
| WO | WO 2015143705 A1 | 10/2015 |

OTHER PUBLICATIONS

PCT/CN2016/086566 English translation International Search Report dated Dec. 8, 2016, 2 pages.
PCT/CN2016/086566 International Search Report and Written Opinion dated Dec. 8, 2016, 13 pages.
Chinese Patent Application No. 201610287147.2, Office Action dated May 17, 2017, 5 pages.
Chinese Patent Application No. 201610163702.0 First Office Action dated Jun. 5, 2017, 4 pages.
Chinese Patent Application No. 201610163702.0 English translation of First Office Action dated Jun. 5, 2017, 6 pages.
Chinese Patent Application No. 201610287114.8 First Office Action dated Jun. 2, 2017, 3 pages.
Chinese Patent Application No. 201610287114.8 English translation of First Office Action dated Jun. 2, 2017, 4 pages.

* cited by examiner

HOUSING, ANTENNA DEVICE AND MOBILE TERMINAL

CROSS-REFERENCE TO RELATED APPLICATION

The present application is a continuation of International Patent Application No. PCT/CN2016/086566, filed on Jun. 21, 2016, which claims the benefit of prior Chinese Applications No. 201610287114.8 filed on Apr. 29, 2016, No. 201610287147.2 filed on Apr. 29, 2016 and No. 201610163702.0 filed on Mar. 21, 2016. The entire contents of the above-mentioned patent applications are incorporated by reference as part of the disclosure of this U.S. application.

FIELD

The present disclosure relates to a technical field of antennas, and more particularly, to a housing, an antenna device using the housing and a mobile terminal using the antenna device.

BACKGROUND

With development of science and technology and users' higher and higher requirements for signals of an electronic product, a gear many of current mobile terminals, such as a mobile phone, having an antenna on the market uses a metal housing, so as to satisfy textures and improve user experience while ensuring strength in use. As is well known, metal is a signal shielding material. In order to avoid the housing from shielding the signals, which influences efficiency function of the antenna, the housing may generally adopt a combination of metal and nonmetal, and for facilitating radiation of signals of the antenna, a proportion of the nonmetal is relatively large, which influences a structure of the terminal.

SUMMARY

A housing is provided by the first aspect of the present disclosure. The housing includes a first housing area, a second housing area, a slit strip and a connecting segment, the slit strip includes at least one slit, the first housing area and the second housing area are located at two sides of the slit strip, the connecting segment are located at an extending path of the slit strip, the connecting segment electrically conductively couples the first housing area and the second housing area.

In another aspect, an antenna device is provided by embodiments of the present disclosure. The antenna device includes a radio frequency transceiver circuit, a matching circuit and a housing, the housing is made from a conducting material, the housing includes a first housing area, a second housing area, a slit strip and a connecting segment, the slit strip comprises at least one slit, the first housing area and the second housing area are located at two sides of the slit strip and the connecting segment is located at an extending path of the slit strip, the matching circuit is electrically connected between the radio frequency transceiver circuit and the housing, the connecting segment is electrically connected between the first housing area and the second housing area, the connecting segment is electrically connected with the matching circuit, so as to allow the connecting segment, the first housing area and the second housing area to serve as a radiation part.

In another aspect, a mobile terminal is provided by embodiments of the present disclosure. The mobile terminal includes a mainboard, a battery, and an antenna device. The antenna device includes a radio frequency transceiver circuit, a matching circuit and a housing. The radio frequency transceiver circuit and the matching circuit are arranged on the mainboard, and the matching circuit is electrically connected between the radio frequency transceiver circuit and the housing. The housing includes: a first housing area, a second housing area, a slit strip and a connecting segment, the slit strip includes at least one metal strip, the slit strip and the connecting segment are located between the first housing area and the second housing area, the first housing area and the second housing area are located at two sides of the slit strip, the slit strip includes two segments extending horizontally, and the connecting segment are located between two segments.

BRIEF DESCRIPTION OF THE DRAWINGS

In order to describe technical solutions of the present disclosure more clearly, drawings to which embodiments need to refer will be briefly explained in below. Obviously, the drawings described in the following are just some embodiments of the present disclosure. To those who have ordinary skills in the art, other drawings like these drawings may also be acquired without creative labors being contributed.

DETAILED DESCRIPTION

Figure 1:
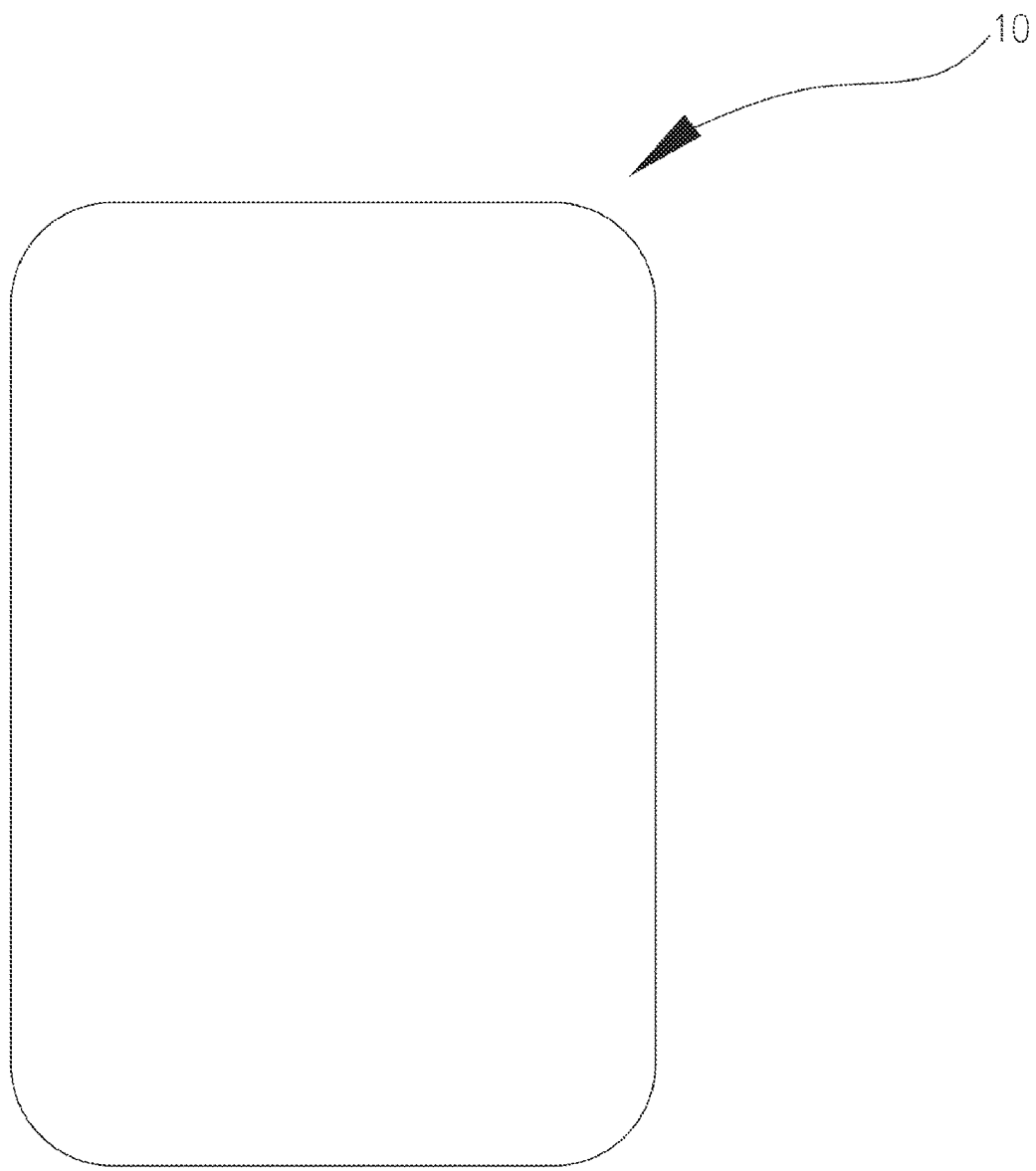
FIG. 1 illustrates a schematic view of a mobile terminal according to embodiments of the present disclosure.

Technical solutions in embodiments of the present disclosure will be clearly and completely described with reference to drawings in embodiments of the present disclosure in the following. Obviously, the embodiments described are just a part of embodiments of the present disclosure, rather than all the embodiments. Based on embodiments of the present disclosure, all the other embodiments acquired by those skilled in the art without making creative labors belong to the protection scope of the present disclosure.

In the specification, it is to be understood that terms such as "left," "right," "upper," "lower," "long," and "short" should be construed to refer to the orientation as then described or as shown in the drawings under discussion. These relative terms are for convenience of description and for simplification of the description, and do not imply or indicate that the referred device or element must have a particular orientation or must be constructed or operated in a particular orientation, and should not be construed as a limitation to the present disclosure thus.

FIG. 1 illustrates a mobile terminal 10 involved in an embodiment of the present disclosure. The mobile terminal 10 includes an antenna device and the mobile terminal 10 may be any device having communication and memory functions, for example, an intelligent device having a network function such as a tablet computer, a mobile phone, an e-reader, a remote control, a personal computer (PC), a laptop computer, a vehicle-mounted device, a network television and a wearable device, etc. The mobile terminal 10 includes the antenna device. The antenna device includes a housing, a radio frequency transceiver circuit and a matching circuit, in which, the housing is generally configured as a rear cover of the mobile terminal 10, and a battery and a mainboard are accommodated in the housing.

A specific structure of the antenna device will be described with reference to the antenna device in the following embodiments.

Figure 2:
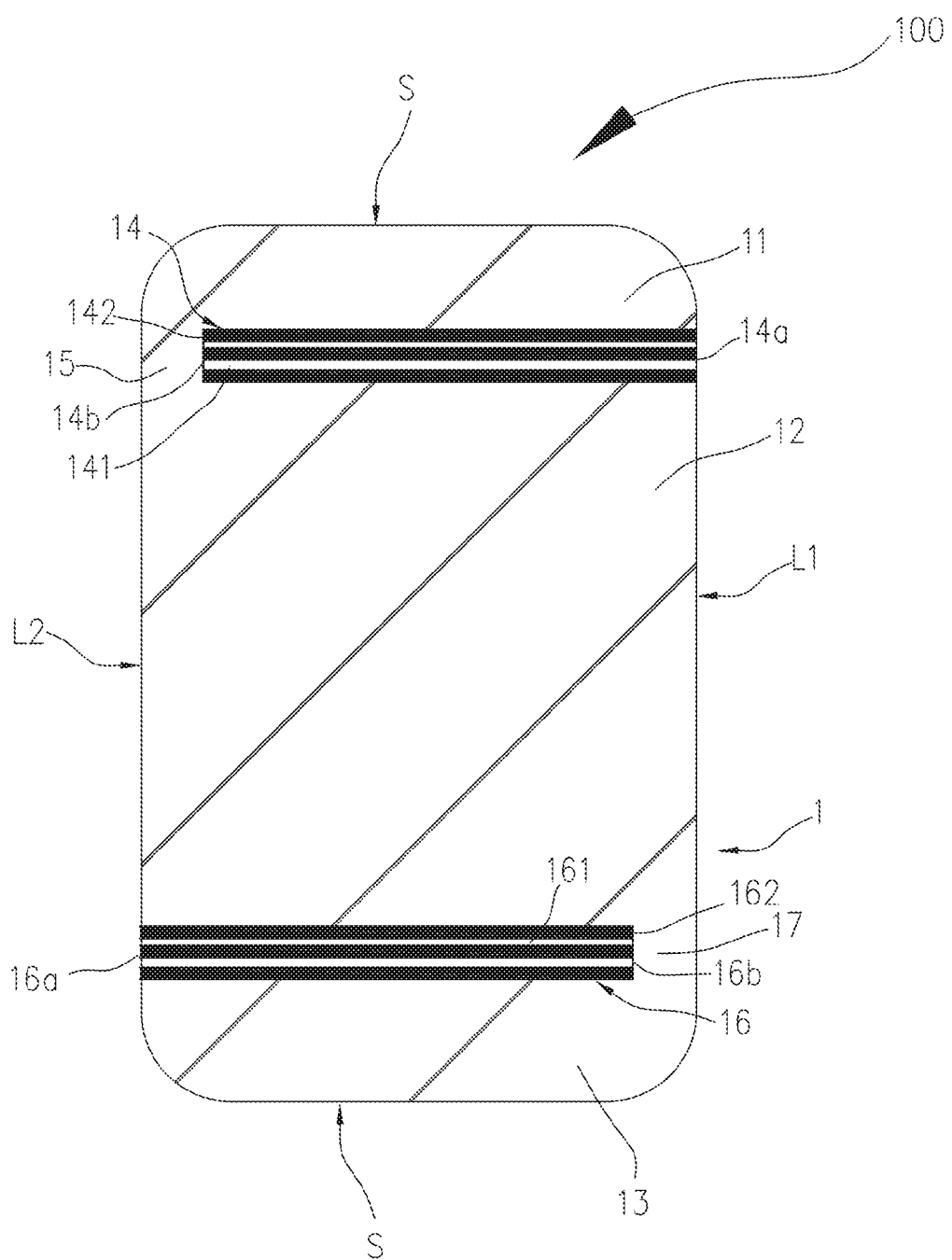
FIG. 2 illustrates a schematic view of an antenna device provided by an example of a first embodiment of the present disclosure.
Figure 6:
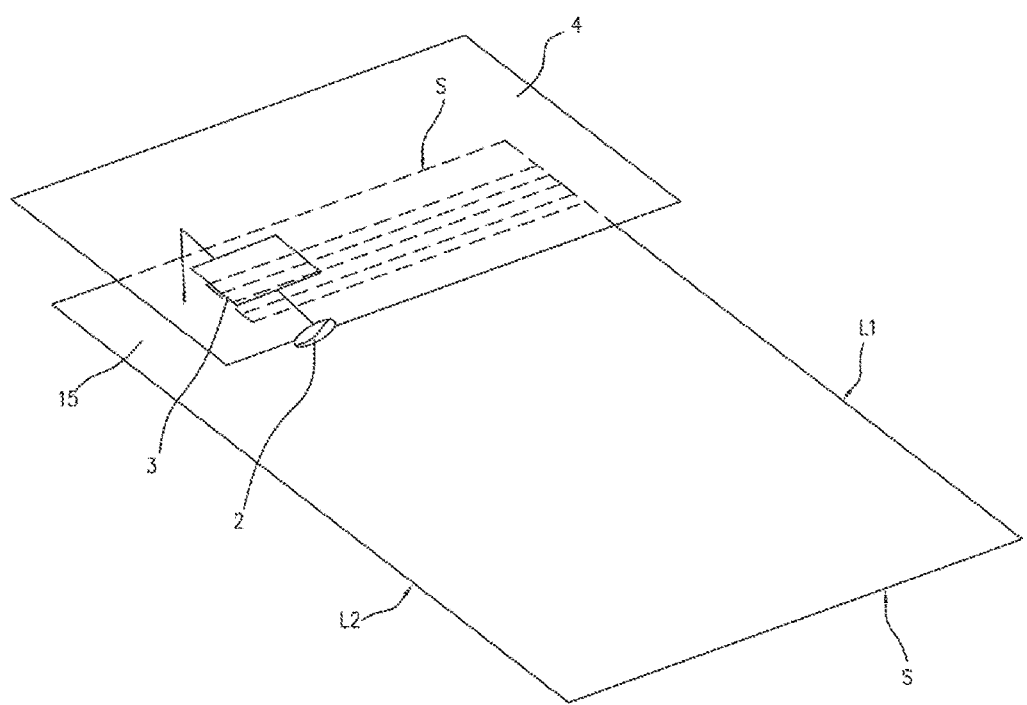
FIG. 6 illustrates a schematic view of an overall structure of an antenna device, a mainboard in a mobile terminal, a matching circuit and a radio frequency transceiver circuit which are arranged on the mainboard in a housing provided by the first embodiment of the present disclosure.

FIG. 2 and FIG. 6 illustrate an antenna device 100 provided by a first embodiment of the present disclosure, the antenna device includes: a housing 1, a radio frequency transceiver circuit 2 and a matching circuit 3. The radio frequency transceiver circuit 2 and the matching circuit 3 are arranged on a mainboard 4 in the mobile terminal, or arranged on a circuit board coupled with the mainboard 4. The matching circuit 3 is electrically connected between the radio frequency transceiver circuit 2 and the housing 1, so as to transmit and receive signals.

As illustrated in FIG. 2, the housing 1 includes a first housing area 11, a second housing area 12, a first slit strip 14 and a first connecting segment 15. The first slit strip 14 is provided with at least one first slit 142. The first slit strip 14 and the first connecting segment 15 are located between the first housing area 11 and the second housing area 12. The first housing area 11 and the second housing area 12 are located at two sides of the first slit strip 14 and the first connecting segment 15 is located at an extending path of the first slit strip 14 of the housing 1.

The housing includes a first side, a second side, a third side and a fourth side which are connected in sequence, the first side is opposite to the third side, the second side is opposite to the fourth side. In some embodiments, the first and third side can be longer or shorter than the second and fourth side.

It could be understood that, the first slit strip 14 is provided with a plurality of first slits 142 parallel to and spaced apart from each other. Specifically, the housing 1 is made from a conducting material which is a whole piece of sheet metal. The housing 1 includes a first long side L1 and a second long side L2 which are opposite to each other and a pair of short sides S opposite to each other. The pair of short sides S are opposite to each other and connected between the first long side L1 and the second long side L2. An area of the conducting material on the housing 1 apart from the first slit strip 14 is defined as a metal area. The first connecting segment 115, the first housing area 11 and the second housing area 12 constitutes the metal area. The first slit strip 14 may be cut in from an edge of the housing 1, but the housing 1 is not completely cut off, thus allowing the structure of the housing 1 to be integrated, thereby enabling the housing 1 to bear a relatively large force. Specifically, a plurality of tiny first metal strips 141 are carved on the housing 1 by means of laser cutting, in which, one first slit 142 is defined between two adjacent first metal strips 141, that is, the plurality of first metal strips 141 parallel to and spaced apart from each other form the first slit strip 14. The housing 1 is divided into the first housing area 11 and the second housing area 12 through the first slit strip 14. Certainly, in other embodiments, the first slit strip 14 may also be formed by cutting via a grinding machine.

Figure 4:
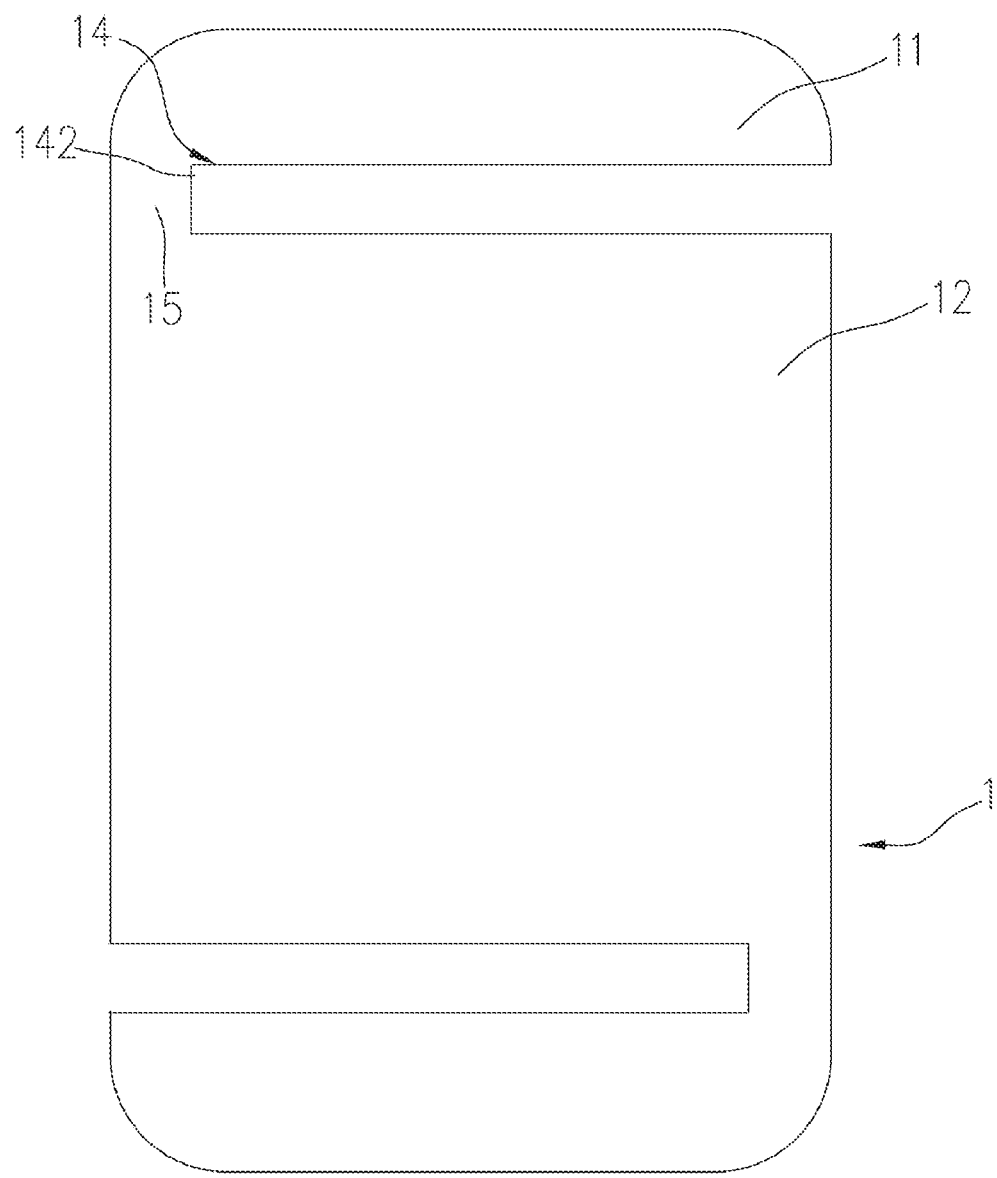
FIG. 4 illustrates a schematic view of an antenna device provided by other embodiments of the present disclosure.
Figure 5:
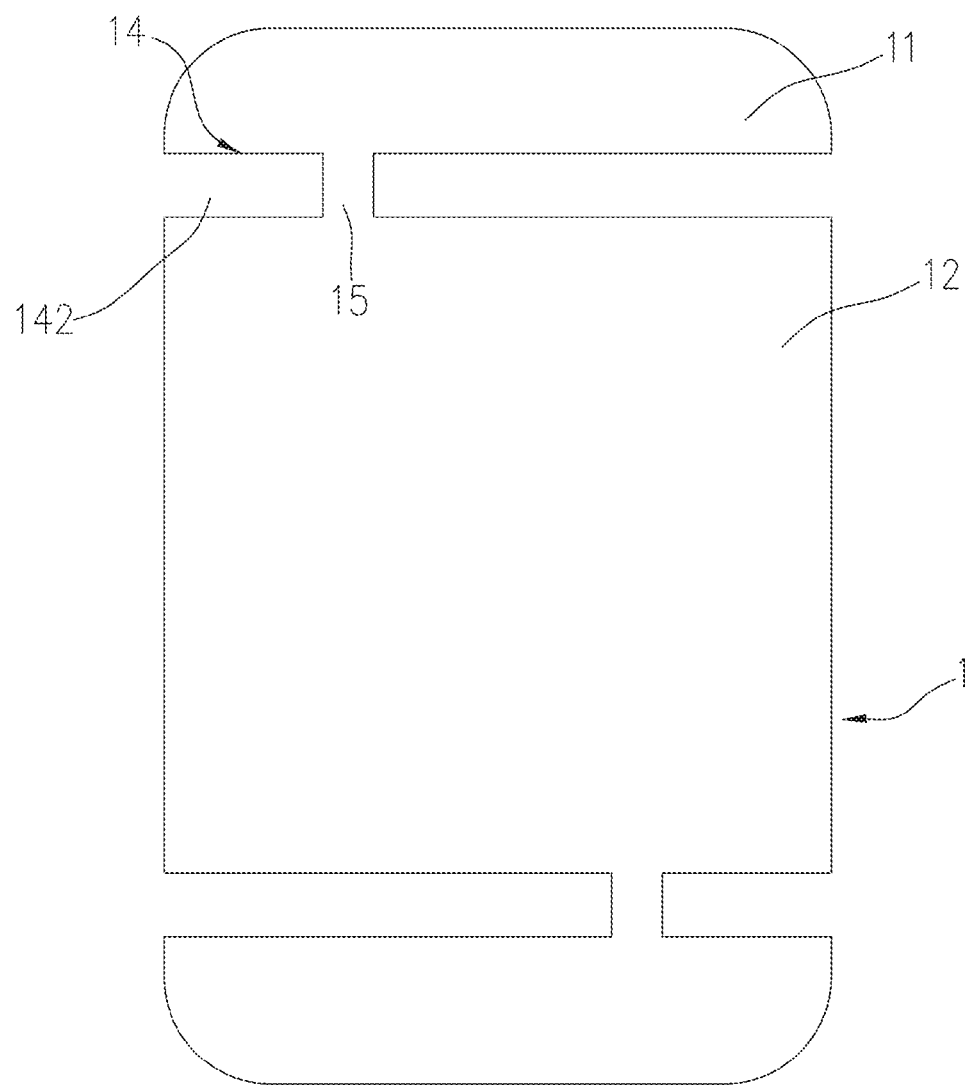
FIG. 5 illustrates a schematic view of another antenna device provided by other embodiments of the present disclosure.

It could be understood that, the first slit 142 is a long rectangular aperture. It could be understood that, the first slit 142 in the first slit strip 14 may be filled with a non-signal shielding material, such as plastics, thereby further improving the appearance integrity of the housing 1 while allowing the housing 1 to have a better waterproofness. Moreover the non-signal shielding material may also transmit the light. When the antenna device 100 is applied to a terminal, a breathing light (not shown) may be arranged in the terminal and corresponding to the first slit strip 14, such that light rays of the breathing light can be transmitted through the light-transmitting non-signal shielding material in the first slit 142 and the user can observe the light rays of the breathing light from outside of the antenna device 100, thereby knowing operation conditions of the terminal, improving appearance effect of the terminal and improving the user experience. Preferably, the light-transmitting non-signal shielding material adopts a light guiding material, thus allowing the first slit strip 14 to present a light strip, thereby improving the appearance effect of the antenna device 100. Certainly, in the other embodiments, as shown in FIGS. 4 and 5, the first slit strip 14 on the housing 1 may be provided with only one first slit 142. The first slit 142 and the first connecting segment 15 divide the housing 1 into the first housing area 11 and the second housing area 12.

The first connecting segment 15 is a conducting material (such as a metal material). The first connecting segment 15 is located at an extending path of the first slit strip 14 of the housing 1, i.e., the first connecting segment 15 and the first slit strip 14 are in the same line on the housing 1. It could be understood that, the extending path of the first slit strip 14 may be straight, i.e., the extending path is at two sides of the first slit strip 14 along the direction of the short side S, and may also be at a middle position of the first slit strip 14. When the extending path of the first slit strip 14 is straight, the first slit strip 14 and the first connecting segment 15 are located between the first housing area 11 and the second housing area 12, and the extending path makes it easy to produce the first slit strip 14 and the first connecting segment 15 on the housing 1. It could be understood that, the extending path of the first slit strip 14 may also be wavy or curved, and the extending path in these shapes may change a bandwidth of the housing 1. The first connecting segment 15 is not only electrically connected between the first housing area 11 and the second housing area 12, but also serves as a feeding point to be electrically connected with the matching circuit 3, thus allowing the metal area to receive a feed signal, thereby allowing the metal area to radiate an electromagnetic wave, i.e., to act as a radiating body of the antenna device 100, thereby forming an antenna radio frequency, that is, the first connecting segment 15, the first housing area 11 and the second housing area 12 server as the radiating body of the antenna device 100. In the meantime, the first housing area 11 and the second housing area 12 have a large area, thereby allowing the antenna device 100 and a mobile terminal having the antenna device 100 to have the high radiation efficiency. It could be understood that, the first connecting segment 15 may also serve as a ground point of the antenna device 100, thus achieving a ground connection function of the radiating body of the antenna device 100. It could be understood that, the first connecting segment 15 is electrically connected with the matching circuit 3 on the mainboard 4 through a resilient metal piece. Certainly, in the other embodiments, the first slit 142 may also be in the shape of a wave, lightning or a long oval, etc.

It could be understood that, the plurality of first metal strips 141 are arranged at equal intervals to each other, and a width of the first slit 142 is less than a width of the first metal strip 141. Specifically, ratio of the width of the first metal strip 141 to the width of the first slit 142 is 1.5 to 2.0, such that a proportion of the first slit 142 is small, and a user can't distinguish the first slit 142 with his naked eyes, thereby improving the appearance effect of the antenna device 100 on the whole. Preferably, the width of the first slit 142 is 0.01 mm to 0.5 mm. More specifically, the width of the first slit 142 is 0.05 mm to 0.3 mm, and the amount of the first metal strips 141 is 5 to 10. The width of the slit between two adjacent first metal strips 141 is ensured to 0.05 mm as a minimum, such that the first slit 142 can't be directly distinguished by the user and the lowest efficiency of the radio frequency of the antenna device 100 is ensured. On the contrary, the width of the first slit 142 is controlled to be 0.3 mm as a maximum, such that the efficiency of the radio frequency of the antenna device 100 is improved. Likely, the amount of the first metal strips 141 is controlled to be 5 as a minimum, so as to ensure appearance requirements of the antenna device 100, and the amount of the first metal strips 141 is controlled to be 10 as a maximum, so as to improve the efficiency of the radio frequency of the antenna device 100. The width of the first slit strip 14 is 1.5 mm to 5.0 mm, such that a proportion of the first slit strip 14 to the overall housing 10 is small, thereby improving the appearance effect of the antenna device 100. In the present embodiment, the width of the first slit 142 is 0.06 mm, thus making the first slit 142 invisible to the naked eyes, thereby improving the appearance integrity of the housing 1. In the other embodiments, the width of the first slit 142 may be 0.01 mm, the width of the first slit 142 may be 0.5 mm, the width of the first slit 142 may be 0.05 mm or the width of the first slit 142 may be 0.3 mm. Preferably, the amount of the first slits 142 may be 2 to 5. In the present disclosure, the amount of the first slits 142 is 3, thereby facilitating radiation of the antenna device 100.

In the following the extending path of the first slit strip 14 being straight is taken as an example. For convenience of description, all the area having the conducting material on the housing 1 apart from the first slit strip 14 is defined as the metal area, and the metal area is configured as a radiation part of the antenna device 100.

It could be understood that, an end of the first slit strip 14 adjacent to the first connecting segment 15 is connected with the first connecting segment 15.

In an embodiment, as illustrated in FIG. 2, the first slit strip 14 includes a first open end 14a and a first closed end 14b opposite to each other. The first open end 14a is located on the first long side L1, and the first closed end 14b of the first slit strip 14 extends from the first long side L1 to the second long side L2, a part of the housing 1 between the first closed end 14b and the second long side L2 forms the first connecting segment 15. By arranging the first slit strip 14 as the above configuration, the proportion of metal in the housing 1 is further improved, thereby improving the appearance integrity of the housing 1 and the mobile terminal. A part of the first metal strip 141 at the first closed end 14b is directly connected with the first connecting segment 15, that is, the first closed end 14b is not isolated from the first connecting segment 15.

Further, the housing 1 further includes a third housing area 13, a second slit strip 16 and a second connecting segment 17. The second slit strip 16 is provided with a plurality of second metal strips 161 parallel to and spaced apart from each other, the second housing area 12 and the third housing area 13 are located at two sides of the second slit strip 16. The second connecting segment 17 is arranged at an extending path of the second slit strip 16 of the housing 1. The second connecting segment 17 is electrically connected between the second housing area 12 and the third housing area 13, and the second connecting segment 17 is electrically connected with the matching circuit 3.

Specifically, the structure of the second slit strip 16 may be the same as the structure of the first slit strip 14, which will not be elaborated herein. The extending path of the second slit strip 16 may be the same as the extending path of the first slit strip 14. By adding the second slit strip 16 and the second connecting segment 17, the housing 1 is divided into the first housing area 11, the second housing area 12 and the third housing area 13, that is, three radiation parts are formed on the housing 1, thereby further improving the radiation efficiency of the antenna device 100 and the mobile terminal.

It could be understood that, the second slit strip 16 includes a second open end 16a and a second closed end 16b opposite to each other, the second open end 16a is located on the second long side L2, the second closed end 16b of the second slit strip 16 extends from the second long side L2 to the first long side L1. A part of the housing 1 between the second closed end 16b and the first long side L1 forms the second connecting segment 17. A part of the second metal strip 161 at the second closed end 16b is directly connected with the second connecting segment 17, that is, the second closed end 16b is not isolated from the second connecting segment 17.

Figure 3:
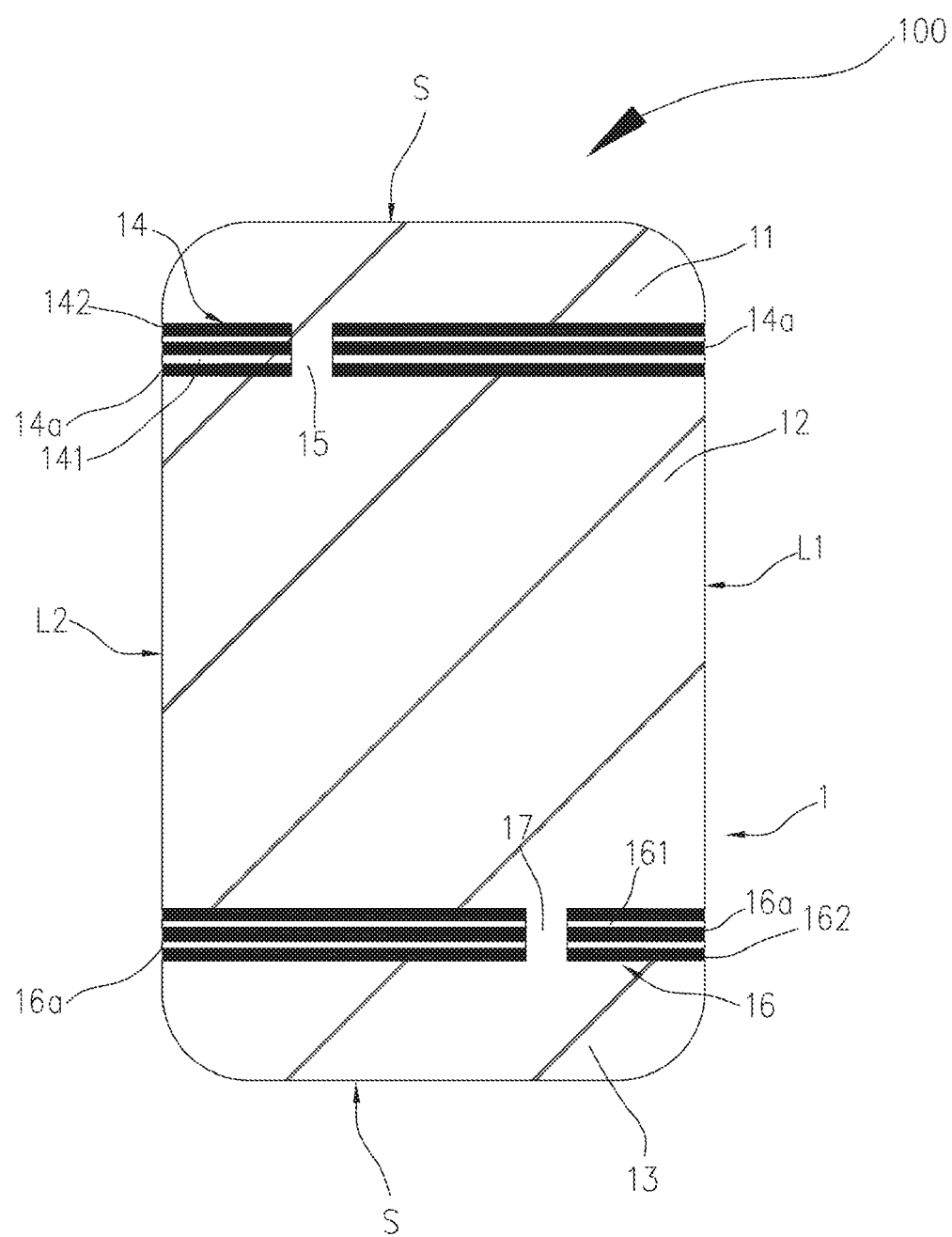
FIG. 3 illustrates a schematic view of an antenna device provided by another example of the first embodiment of the present disclosure.

In another embodiment, as illustrated FIG. 3, the housing 1 includes the first long side L1 and the second long side L2 which are opposite to each other and a pair of short sides S. The pair of short sides S are opposite to each other and connected between the first long side L1 and the second long side L2. The first slit strip 14 extends from the first long side L1 to the second long side L2, and the first connecting segment 15 stretches across the first slit strip 14. Specifically, the first slit strip 14 has two first open ends 14a, and the two first open ends 14a are located on the first long side L1 and the second long side L2 respectively. The first connecting segment 15 stretches across the first slit strip 14. That is, the first housing area 11 and the second housing area 12 are completed separated by the first slit strip 14, and the first connecting segment 15 is a conducting plate independent of the housing 1. During the manufacturing, the first slit strip 14 is formed firstly, and then the first connecting segment 15 is fabricated. The first connecting segment 15 may be located at any position on the first slit strip 14. A part of the first metal strip 141 adjacent to the first connecting segment 15 is directly connected with the first connecting segment 15, and the first metal strip 14 is not isolated from the first connecting segment 15.

Further, the housing 1 further includes the third housing area 13, the second slit strip 16 and the second connecting segment 17. The second slit strip 16 is provided with a plurality of second metal strips 161 parallel to and spaced apart from each other. The second housing area 12 and the third housing area 13 are located at two sides of the second slit strip 16. The second connecting segment 17 is arranged at an extending path of the second slit strip 16 of the housing 1. The second connecting segment 17 is electrically connected between the second housing area 12 and the third housing area 13, and the second connecting segment 17 is electrically connected with the matching circuit 3.

Specifically, the structure of the second slit strip 16 may be the same as the structure of the first slit strip 14, which will not be elaborated herein. The extending path of the second slit strip 16 may be the same as the extending path of the first slit strip 14. By adding the second slit strip 16 and the second connecting segment 17, the housing 1 is separated into the first housing area 11, the second housing area 12 and the third housing area 13, that is, three radiation parts are formed on the housing 1, thereby further improving the radiation efficiency of the antenna device 100 and the mobile terminal. It could be understood that, the second slit strip 16 extends from the first long side L1 to the second long side L2, and the second connecting segment 17 stretches across the second slit strip 16. A part of the second metal strip 161 adjacent to the second connecting segment 17 is directly connected with the second connecting segment 17, that is, the second metal strip 161 is not isolated from the second connecting segment 17.

In an embodiment, the first slit strip 14 is parallel to the second slit strip 16.

In embodiments of the present disclosure, the radiating body of antenna device 100 is arranged to the housing 1 of the mobile terminal, and the housing 1 is divided into at least two housing areas (the first housing area 11, the second housing area 12 and the third housing area 13) through the slit strip (the first slit strip 14 and/or the second slit strip 16) to form the radiation parts of the antenna device 100. The at least two housing areas are electrically connected through the connecting segment (the first connecting segment 15 and the second connecting segment 17) and the feed is achieved by electrically connecting the connecting segment with the matching circuit 3 of the antenna device 100. The design of the radiating body of antenna device 100 provided by the present disclosure makes use of the structure of the housing 1 of the mobile terminal, the radiation area is large and no additional radiating body of an antenna is needed, thereby not only improving the radiation efficiency of the antenna device 100, but also simplifying the overall structure of the mobile terminal, and facilitating reduction of the cost of the mobile terminal. Moreover the slit strip is composed of a plurality of metal strips (the first metal strip 141 or the second metal strip 161) parallel to and spaced apart from each other, thus allowing the slit strip to be invisible to the naked eyes, thereby improving the appearance integrity of the housing 1.

Figure 7:
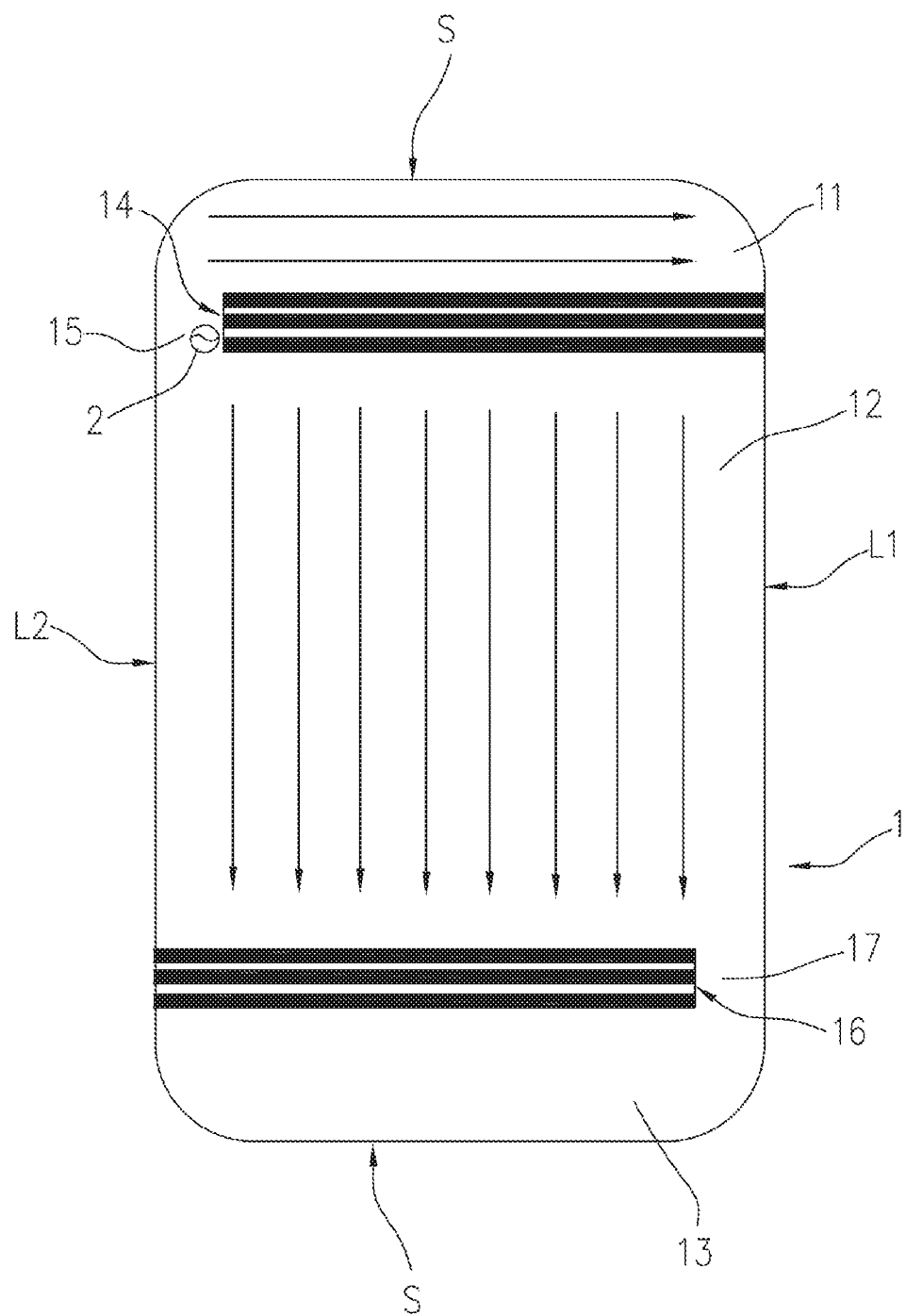
FIG. 7 illustrates a schematic view of a current distribution of a housing of an antenna device provided by the first embodiment of the present disclosure.

FIG. 7 illustrates a schematic view of a current distribution of the housing 1 of the antenna device 100. In FIG. 6, the first connecting segment 15 is connected with the matching circuit 3 to serve as the feeding point, such that the current in the first housing area 11 flows from the second long side L2 to the first long side L1, and the current in the second housing area 12 flows from the first slit strip 14 to a direction perpendicular to the first slit strip 14.

Figure 8:
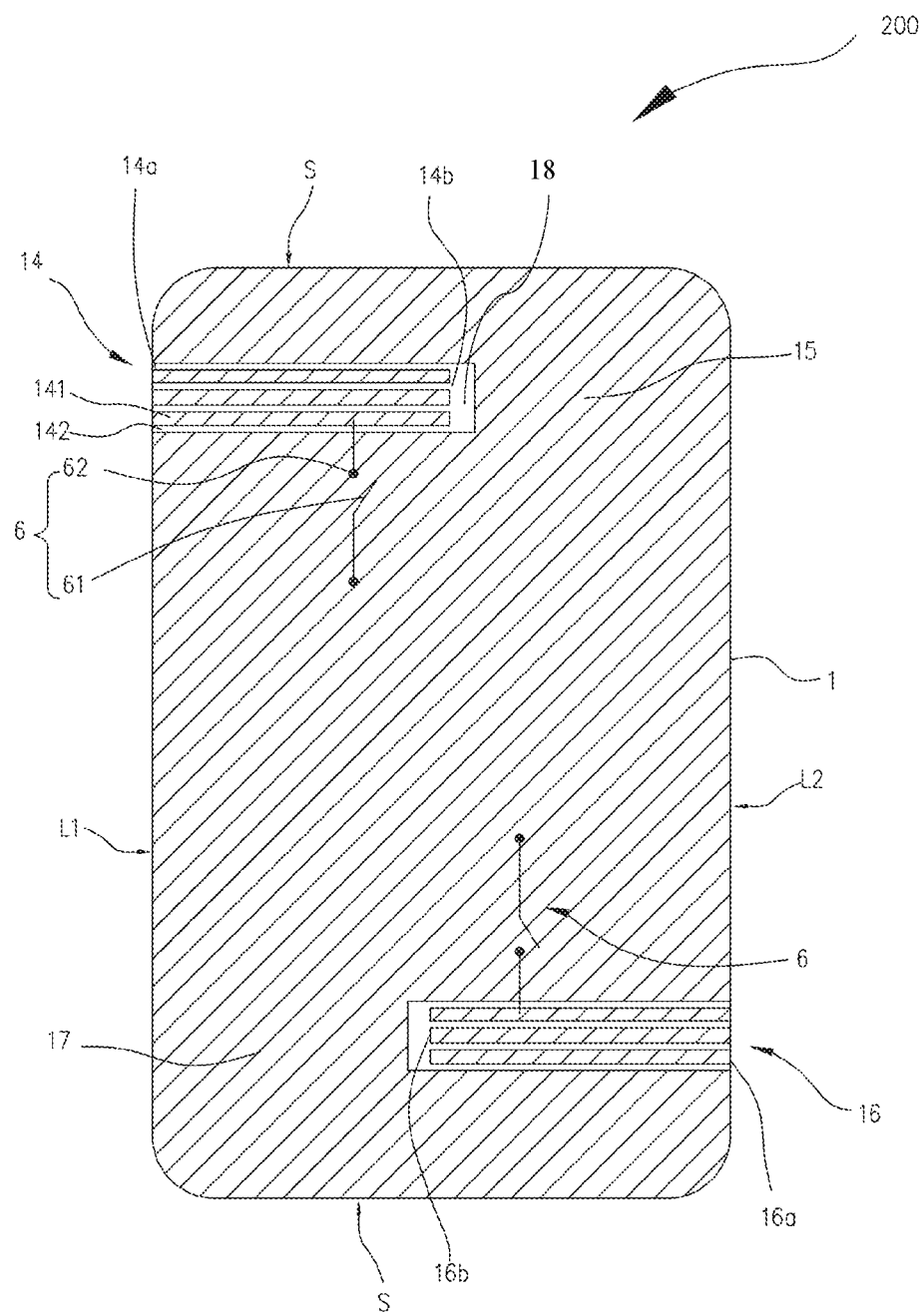
FIG. 8 illustrates a schematic view of an antenna device provided by an example of a second embodiment of the present disclosure.
Figure 9:
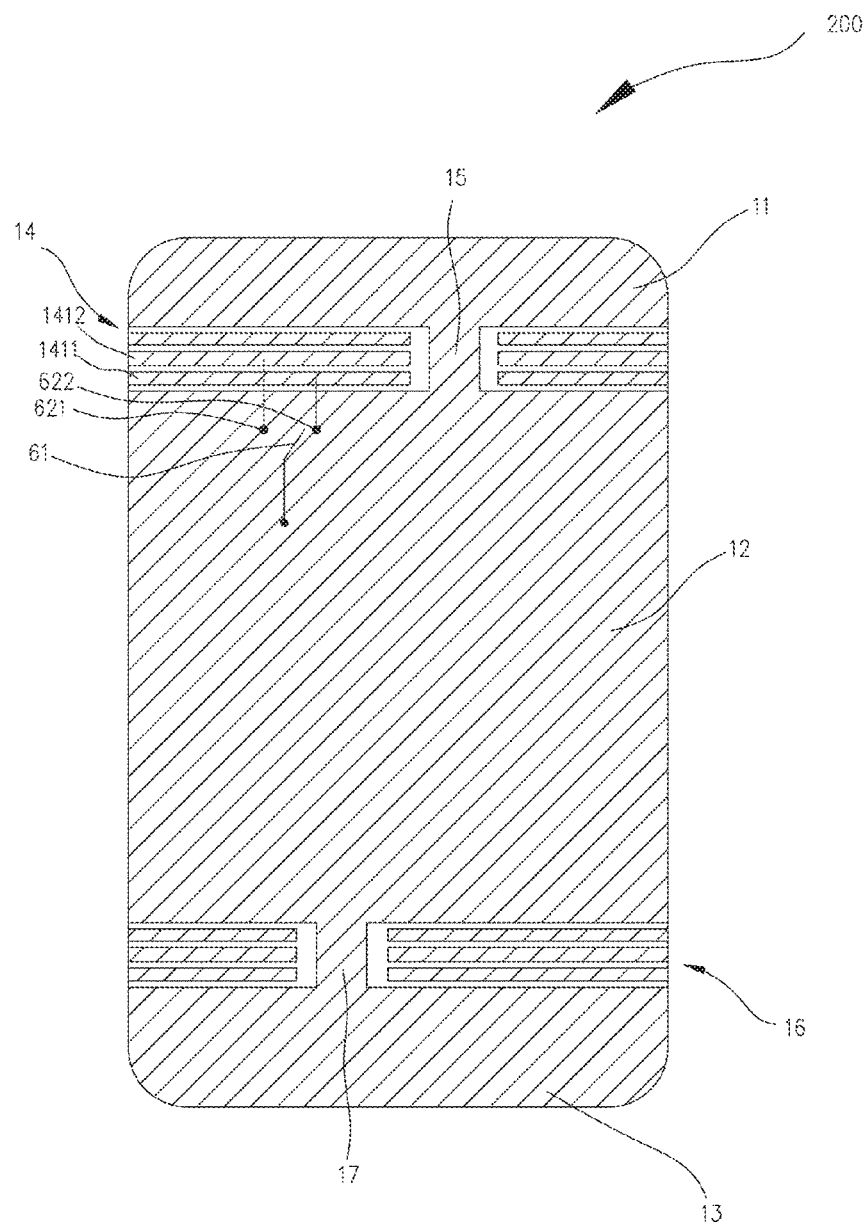
FIG. 9 illustrates a schematic view of an antenna device provided by another example of the second embodiment of the present disclosure.

FIGS. 8 and 9 illustrate an antenna device 200 provided by a second embodiment of the present disclosure. The antenna device 200 is generally the same as the antenna device 100 provided by the first embodiment. The difference is that an end of the first slit strip 14 adjacent to the first connecting segment 15 is isolated from the first connecting segment 15, for example, by an insulator 18, and the antenna device 200 is further provided with a switch 6 for correspondence to the structure of the first slit strip 14. The switch 6 is connected with one first metal strip 141 of the first slit strip 14 and is configured to turn on or off the electrical connection between the radiation part and the first metal strip 141. By isolating the first metal strip 141 from the metal area of the housing 1 apart from the first slit strip 14, i.e., the radiation part (the first connecting segment, the first housing area and the second housing area), and by using the switch 6 to control a conducting state between the first metal strip 141 and the radiation part, a resonance frequency of the radiation part may change, that is, a frequency band of the antenna device 200 increases, thereby increasing the bandwidth and improving the user experience.

It could be understood that, the switch 6 may be a single-pole multi-throw switch, and may also be a single-pole single-throw switch. Specifically, the switch 6 includes a moving contact 61 and a fixed contact 62, the moving contact 61 is electrically connected with the radiation part, and the fixed contact 62 is electrically connected with the first metal strip 141. The moving contact 61 may be connected with the fixed contact 62 or disconnected from the fixed contact 62, thereby turning on or off the electrical connection between the radiation part and the first metal strip 141. The moving contact 61 may be connected with a central processing unit of the terminal, so as to be connected with the fixed contact 62 according to a control signal of the terminal. The amount of the fixed contact 62 may be one or more, the one or more fixed contacts 62 may be correspondingly connected to the one or more first metal strips 141.

As shown in FIG. 8, the amount of the fixed contact 62 of the switch 6 is one, the one fixed contact 62 is electrically connected with one of the first metal strips 141. When the moving contact 61 is connected with the fixed contact 62, the first metal strip 141 electrically connected with the fixed contact 62 is connected with the radiation part through the moving contact 61, thereby changing the electromagnetic wave of the radiation part which generates a first resonance frequency. When the fixed contact 62 is disconnected from the first metal strip 141, the first metal strip 141 is disconnected from the metal area, and the metal area radiates an electromagnetic wave with a second resonance frequency, the second resonance frequency is different from the first resonance frequency, such that the antenna device may produce the electromagnetic signals with different resonance frequencies, thereby increasing the bandwidth and improving the user experience.

As shown in FIG. 9, the amount of the fixed contact 62 of the switch 6 is two, the two fixed contacts 62 are electrically connected with two first metal strips 141, the moving contact 61 is connected with or disconnected from one of the fixed contacts 62. Specifically, the two fixed contacts 62 are a first fixed contact 621 and a second fixed contact 622 respectively. The plurality of first metal strips 141 include one first metal strip 1411 and another first metal strip 1412. The two first metal strips 141 are adjacent to each other. Compared with the other one first metal strip 1412, the one first metal strip 1411 is more adjacent to the second housing area 12, that is, distance from the one first metal strip 1411 to the second housing area 12 is less than distance from the other one first metal strip 1412 to the second housing area 12. The first fixed contact 621 is electrically connected with the one first metal strip 1411, and the second fixed contact 622 is electrically connected with the other one first metal strip 1412. When the moving contact 61 is connected with the one first metal strip 1411, the radiation part radiates the electromagnetic wave with the first resonance frequency. When the moving contact 61 is connected with the other one first metal strip 1412, the slit dimension between the other one first metal strip 1412 and the second radiation part 12 is larger than the slit dimension between the one first metal strip 1411 and the radiation part, thereby changing the resonance frequency radiated by the radiation part, that is, the radiation part radiates an electromagnetic wave with a third resonance frequency and the third resonance frequency is different from the first resonance frequency and the second resonance frequency. The antenna device 200 can further radiate more electromagnetic waves with different resonance frequencies, thereby achieving more frequency bands and making it more convenient for the user to select among different frequency bands, and further increasing the bandwidth of the antenna. Likely, in the other embodiments, a plurality of fixed contacts 62 correspondingly and electrically connected to the plurality of first metal strips 141 may also be provided, thus resulting in different resonance frequencies radiated by the radiation part according to the slit of different dimensions formed between each first metal strip 141 and the radiation part, thereby achieving more frequency bands and providing more selections of frequency band for the user.

In an embodiment, as illustrated in FIG. 8, the first slit strip 14 includes the first open end 14a and the first closed end 14b opposite to each other. The first open end 14a is located on the first long side L1, and the first closed end 14b of the first slit strip 14 extends from the first long side L1 to the second long side L2, a part of the housing 1 between the first closed end 14b and the second long side L2 forms the first connecting segment 15. By arranging the first slit strip 14 as the above configuration, the proportion of metal in the housing 1 is further improved, thereby improving the appearance integrity of the housing 1 and the mobile terminal. The part of the first metal strip 141 at the first closed end 14b is isolated from the first connecting segment 15, that is, the first closed end 14b is isolated from the first connecting segment 15.

Further, the housing 1 further includes the third housing area 13, the second slit strip 16 and the second connecting segment 17. The second slit strip 16 is provided with a plurality of second metal strips 161 parallel to and spaced apart from each other, the second housing area 12 and the third housing area 13 are located at two sides of the second slit strip 16. The second connecting segment 17 is arranged at an extending path of the second slit strip 16 of the housing 1. The second connecting segment 17 is electrically connected between the second housing area 12 and the third housing area 13, and the second connecting segment 17 is electrically connected with the matching circuit 3.

Specifically, the structure of the second slit strip 16 may be the same as the structure of the first slit strip 14, which will not be elaborated herein. The extending path of the second slit strip 16 may be the same as the extending path of the first slit strip 14. By adding the second slit strip 16 and the second connecting segment 17, the housing 1 is divided into the first housing area 11, the second housing area 12 and the third housing area 13, that is, three radiation parts are formed on the housing 1, thereby further improving the radiation efficiency of the antenna device 100 and the mobile terminal.

It could be understood that, the second slit strip 16 includes the second open end 16a and the second closed end 16b opposite to each other, the second open end 16a is located on the second long side L2, the second closed end 16b of the second slit strip 16 extends from the second long side L2 to the first long side L1. A part of the housing 1 between the second closed end 16b and the first long side L1 forms the second connecting segment 17. The part of the second metal strip 161 at the second closed end 16b is directly connected with the second connecting segment 17, that is, the second closed end 16b is in not isolated from the second connecting segment 17.

In another embodiment, as illustrated in FIG. 9, the housing 1 includes the first long side L1 and the second long side 12 which are opposite to each other and a pair of short sides S. The short sides S are opposite to each other and connected between the first long side L1 and the second long side L2. The first slit strip 14 extends from the first long side L1 to the second long side L2, and the first connecting segment 15 stretches across the first slit strip 14. Specifically, the first slit strip 14 has two first open ends 14a, and the two first open ends 14a are located on the first long side L1 and the second long side L2 respectively. The first connecting segment 15 stretches across the first slit strip 14. That is, the first housing area 11 and the second housing area 12 are completed separated by the first slit strip 14, and the first connecting segment 15 is a conducting plate independent of the housing 1. During the manufacturing, the first slit strip 14 is formed firstly, and then the first connecting segment 15 is fabricated. The first connecting segment 15 may be located at any position on the first slit strip 14. The part of the first metal strip 141 adjacent to the first connecting segment 15 is isolated from the first connecting segment 15, and the first metal strip 14 is isolated from the first connecting segment 15.

Further, the housing 1 further includes the third housing area 13, the second slit strip 16 and the second connecting segment 17. The second slit strip 16 is provided with a plurality of second metal strips 161 parallel to and spaced apart from each other. The second housing area 12 and the third housing area 13 are located at two sides of the second slit strip 16. The second connecting segment 17 is arranged at an extending path of the second slit strip 16 of the housing 1. The second connecting segment 17 is electrically connected between the second housing area 12 and the third housing area 13, and the second connecting segment 17 is electrically connected with the matching circuit 3.

Specifically, the structure of the second slit strip 16 may be the same as the structure of the first slit strip 14, which will not be elaborated herein. The extending path of the second slit strip 16 may be the same as the extending path of the first slit strip 14. By adding the second slit strip 16 and the second connecting segment 17, the housing 1 is divided into the first housing area 11, the second housing area 12 and the third housing area 13, that is, three radiation parts are formed on the housing 1, thereby further improving the radiation efficiency of the antenna device 100 and the mobile terminal. It could be understood that, the second slit strip 16 extends from the first long side L1 to the second long side L2, and the second connecting segment 17 stretches across the second slit strip 16. A part of the second metal strip 161 adjacent to the second connecting segment 17 is isolated from the second connecting segment 17, that is, the second metal strip 161 is isolated from the second connecting segment 17.

In an embodiment, the first slit strip 14 is parallel to the second slit strip 16.

In embodiments of the present disclosure, the radiating body of antenna device 200 is arranged to the housing 1 of the mobile terminal, and the housing 1 is divided into at least two housing areas (the first housing area 11, the second housing area 12 and the third housing area 13) through the slit strip (the first slit strip 14 and/or the second slit strip 16) to form the radiation part of the antenna device 200. The at least two housing areas are electrically connected through the connecting segment (the first connecting segment 15 and the second connecting segment 17) and the feed is achieved by electrically connecting the connecting segment with the matching circuit 3 of the antenna device 200.

The radiating body of antenna device 200 provided by the present disclosure is designed by making use of the structure of the housing 1 of the mobile terminal, the radiation area is large and no additional radiating body of an antenna is needed, thereby not only improving the radiation efficiency of the antenna device 200, but also simplifying the overall structure of the mobile terminal, and facilitating reduction of the cost of the mobile terminal. Moreover the slit strip is composed of a plurality of metal strips (the first metal strip 141 or the second metal strip 161) parallel to and spaced apart from each other, thus allowing the slit strip to be invisible to the naked eyes, thereby improving the appearance integrity of the housing 1.

In the antenna device 200 according to embodiments of the present disclosure, by isolating the first metal strip 141 from the metal area of the housing 1 apart from the first slit strip 14, i.e., the radiation part (the first connecting segment, the first housing area and the second housing area), and by using the switch 6 to control a conducting state between the first metal strip 141 and the radiation part, a resonance frequency of the radiation part may change, that is, a frequency band of the antenna device 200 increases, thereby increasing the bandwidth and improving the user experience.

The embodiments of the present disclosure are described in detail in the above. Specific examples are applied to the present specification to explain principles and embodiments of the present disclosure, the description of the above embodiment is just for understanding method and the core thoughts of the present disclosure. In the meantime, to those skilled in the art, based on the thoughts of the present disclosure, there may be a change within the scope of the embodiments and the application. From the above, details of the present disclosure should not be construed to limit the present disclosure.

What is claimed is:

1. A metal housing comprising a first housing area, a second housing area, a slit strip and a common housing area, the slit strip comprising at least one slit, the common housing area being located at an extending path of the slit strip and forming a linear segment together with the slit strip, the first housing area and the second housing area being located at two sides of the linear segment, the common housing area electrically conductively coupling the first housing area and the second housing area, and the common housing area being electrically coupled with a matching circuit, so as to allow the common housing area, the first housing area and the second housing area to serve as a radiation part, wherein the housing further comprises a third housing area, another slit strip and another common housing area, the another slit strip defines at least one slit, the another common housing area is located at an extending path of the another slit strip and forming another linear segment together with the another slit strip, the second housing area and the third housing area are located at two sides of the another linear segment, and wherein the housing comprises a first side, a second side, a third side and a fourth side which are connected in sequence, the first side is opposite to the third side, the second side is opposite to the fourth side, the slit strip comprises a first open end and a first closed end opposite to each other, the first open end is located on the first side, and the first closed end of the slit strip extends from the first side to the third side, and the common housing area is located between the first closed end and the third side; the another slit strip comprises a second open end and a second closed end opposite to each other, the second open end is located on the third side, the second closed end of the another slit strip extends from the third side to the first side, and the another common housing area is located between the second closed end and the first side.

2. The housing according to claim 1, wherein the slit strip has an end adjacent to the common housing area and connected with the common housing area.

3. The housing according to claim 2, wherein the end is directly connected with the common housing area.

4. The housing according to claim 1, wherein the slit strip has an end adjacent to the common housing area and isolated from the common housing area.

5. The housing according to claim 4, wherein the end is isolated from the common housing area by an insulator.

6. The housing according to claim 1, wherein the amount of the slit is at least two, the at least two slits are parallel to and spaced apart from each other, a metal strip is provided between the two adjacent slits.

7. The housing according to claim 6, wherein a width of the slit is 0.01 mm; or
the width of the slit is 0.5 mm; or
the width of the slit is 0.01 mm to 0.5 mm.

8. An antenna device comprising a radio frequency transceiver circuit, a matching circuit and a housing, wherein the housing is made from a conducting material, the housing comprises a first housing area, a second housing area, a slit strip and a common housing area, the slit strip comprises at least one slit, the common housing area is located at an extending path of the slit strip and forms a linear segment together with the slit strip, the first housing area and the second housing area are located at two sides of the linear segment, the matching circuit is electrically coupled between the radio frequency transceiver circuit and the housing, the common housing area is electrically connected between the first housing area and the second housing area, the first housing area and the second housing area each are metal materials, the common housing area is electrically coupled with the matching circuit, so as to allow the common housing area, the first housing area and the second housing area to serve as a radiation part, wherein the amount of the slit is at least two, the at least two slits are parallel to and spaced apart from each other, a metal strip is provided between the two adjacent slits, wherein the slit strip has an end adjacent to the common housing area and isolated from the common housing area, and wherein the antenna device further comprises a switch, the switch is connected with one metal strip of the slit strip and is configured to turn on or off electrical connection between the radiation part and the metal strip.

9. The antenna device according to claim 8, wherein the switch comprises a moving contact and a fixed contact, the moving contact is electrically connected with the radiation part, and the fixed contact is electrically connected with the metal strip, the moving contact is connected with the fixed contact or disconnected from the fixed contact, thereby turning on or off the electrical connection between the radiation part and the metal strip.

10. The antenna device according to claim 9, wherein the amount of the fixed contact of the switch is one, the one fixed contact is electrically connected with one metal strip.

11. The antenna device according to claim 9, wherein the amount of the fixed contact of the switch is two, the two fixed contacts are electrically connected with two metal strips.

12. The antenna device according to claim 8, wherein the housing further comprises a third housing area, another slit strip and another common housing area, the another slit strip defines at least one slit, the another common housing area is located at an extending path of the another slit strip and forming another linear segment together with the another slit strip, the second housing area and the third housing area are located at two sides of the another linear segment, and wherein the housing comprises a first side, a second side, a third side and a fourth side which are connected in sequence, the first side is opposite to the third side, the second side is opposite to the fourth side, the slit strip comprises a first open end and a first closed end opposite to each other, the first open end is located on the first side, and the first closed end of the slit strip extends from the first side to the third side, and the common housing area is located between the first closed end and the third side; the another slit strip comprises a second open end and a second closed end opposite to each other, the second open end is located on the third side, the second closed end of the another slit strip extends from the third side to the first side, and the another common housing area is located between the second closed end and the first side.

13. The antenna device according to claim 8, wherein a width of the slit is 0.01 mm; or the width of the slit is 0.5 mm; or the width of the slit is 0.01 mm to 0.5 mm.

14. A mobile terminal comprising:

a mainboard;

a battery; and an antenna device, comprising a radio frequency transceiver circuit, a matching circuit and a housing, the radio frequency transceiver circuit and the matching circuit being arranged on the mainboard, and the matching circuit being electrically connected between the radio frequency transceiver circuit and the housing, and the housing comprising: a first housing area, a second housing area, a slit strip and a common housing area, the slit strip comprising at least one metal strip, the common housing area being located at an extending path of the slit strip and forming a linear segment together with the slit strip, the first housing area and the second housing area being located at two sides of the linear segment, the common housing area electrically conductively coupling the first housing area and the second housing area, and the common housing area being electrically coupled with a matching circuit, so as to allow the common housing, the first housing area and the second housing area to serve as a radiation part, wherein the slit strip has an end adjacent to the common housing area and isolated from the common housing area, wherein the amount of the slit is at least two, the at least two slits are parallel to and spaced apart from each other, a metal strip is provided between the two adjacent slits, and wherein the antenna device further comprises a switch, the switch is connected with one metal strip of the slit strip and is configured to turn on or off electrical connection between the radiation part and the metal strip.

15. The mobile terminal according to claim 14, wherein the housing further comprises a third housing area, another slit strip and another common housing area, the another slit strip defines at least one slit, the another common housing area is located at an extending path of the another slit strip and forming another linear segment together with the another slit strip, the second housing area and the third housing area are located at two sides of the another linear segment, and wherein the housing comprises a first side, a second side, a third side and a fourth side which are connected in sequence, the first side is opposite to the third side, the second side is opposite to the fourth side, the slit strip comprises a first open end and a first closed end opposite to each other, the first open end is located on the first side, and the first closed end of the slit strip extends from the first side to the third side, and the common housing area is located between the first closed end and the third side; the another slit strip comprises a second open end and a second closed end opposite to each other, the second open end is located on the third side, the second closed end of the another slit strip extends from the third side to the first side, and the another common housing area is located between the second closed end and the first side.

16. The mobile terminal according to claim 14, wherein a width of the slit is 0.01 mm; or the width of the slit is 0.5 mm; or the width of the slit is 0.01 mm to 0.5 mm.

17. The mobile terminal according to claim 14, wherein the switch comprises a moving contact and a fixed contact, the moving contact is electrically connected with the radiation part, and the fixed contact is electrically connected with the metal strip, the moving contact is connected with the fixed contact or disconnected from the fixed contact, thereby turning on or off the electrical connection between the radiation part and the metal strip.

18. The mobile terminal according to claim 17, wherein the amount of the fixed contact of the switch is one, the one fixed contact is electrically connected with one metal strip.

19. The mobile terminal according to claim 17, wherein the amount of the fixed contact of the switch is two, the two fixed contacts are electrically connected with two metal strips.

* * * * *